(12) United States Patent
Cheng et al.

(10) Patent No.: US 11,069,577 B2
(45) Date of Patent: Jul. 20, 2021

(54) NANOSHEET TRANSISTORS WITH DIFFERENT GATE DIELECTRICS AND WORKFUNCTION METALS

(71) Applicant: INTERNATIONAL BUSINESS MACHINES CORPORATION, Armonk, NY (US)

(72) Inventors: Kangguo Cheng, Schenectady, NY (US); Choonghyun Lee, Rensselaer, NY (US); Juntao Li, Albany, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/690,609

(22) Filed: Nov. 21, 2019

(65) Prior Publication Data
US 2020/0091009 A1 Mar. 19, 2020

Related U.S. Application Data

(63) Continuation of application No. 15/787,818, filed on Oct. 19, 2017, now Pat. No. 10,553,495.

(51) Int. Cl.
*H01L 21/02* (2006.01)
*H01L 21/8238* (2006.01)
(Continued)

(52) U.S. Cl.
CPC ...... *H01L 21/823807* (2013.01); *B82Y 10/00* (2013.01); *H01L 21/0257* (2013.01);
(Continued)

(58) Field of Classification Search
CPC ............... H01L 21/02; H01L 21/02107; H01L 21/02109; H01L 21/02378;
(Continued)

(56) References Cited

U.S. PATENT DOCUMENTS 8,422,273 B2  4/2013  Chang et al.
8,778,768 B1  7/2014  Chang et al.
(Continued)

FOREIGN PATENT DOCUMENTS

CN  101075562  11/2007
TW  200629418  8/2006

OTHER PUBLICATIONS

List of IBM Patents or Patent Applications Treated as Related dated Nov. 21, 2019, 2 pages.
(Continued)

*Primary Examiner* — Natalia A Gondarenko
(74) *Attorney, Agent, or Firm* — Tutunjian & Bitetto, P.C.; Randall Bluestone

(57) ABSTRACT

Methods of forming semiconductor devices include patterning a stack of layers that includes channel layers, n-type doped first sacrificial layers between the channel layers, and carbon-doped second sacrificial layers between the channel layers and the first sacrificial layers, to form one or more device regions. The first sacrificial layers and the second sacrificial layers are recessed relative to the channel layers with distinct respective etches to produce a flat, continuous, and vertical surface from sidewalls of the first sacrificial layers and respective second sacrificial layers. Inner spacers are formed in recesses formed by the recessing of the first sacrificial layers and the second sacrificial layers. The first sacrificial layers and the second sacrificial layers are etched away to leave the channel layers suspended.

20 Claims, 6 Drawing Sheets

(51) Int. Cl.
- *H01L 29/06* (2006.01)
- *H01L 27/092* (2006.01)
- *H01L 21/822* (2006.01)
- *H01L 29/08* (2006.01)
- *H01L 29/66* (2006.01)
- *H01L 29/775* (2006.01)
- *H01L 29/423* (2006.01)
- *B82Y 10/00* (2011.01)
- *H01L 27/06* (2006.01)
- *H01L 21/3065* (2006.01)
- *H01L 29/49* (2006.01)
- *H01L 29/786* (2006.01)

(52) U.S. Cl.
CPC .. *H01L 21/02532* (2013.01); *H01L 21/02603* (2013.01); *H01L 21/3065* (2013.01); *H01L 21/8221* (2013.01); *H01L 21/82385* (2013.01); *H01L 21/823814* (2013.01); *H01L 21/823842* (2013.01); *H01L 21/823857* (2013.01); *H01L 27/0688* (2013.01); *H01L 27/092* (2013.01); *H01L 27/0922* (2013.01); *H01L 29/0673* (2013.01); *H01L 29/0847* (2013.01); *H01L 29/42376* (2013.01); *H01L 29/42392* (2013.01); *H01L 29/4908* (2013.01); *H01L 29/66439* (2013.01); *H01L 29/66545* (2013.01); *H01L 29/775* (2013.01); *H01L 29/78651* (2013.01); *H01L 29/78696* (2013.01); *H01L 2029/42388* (2013.01)

(58) Field of Classification Search
CPC ......... H01L 21/02381; H01L 21/02428; H01L 21/02444; H01L 21/0245; H01L 21/02496; H01L 21/02505; H01L 21/02507; H01L 21/02518; H01L 21/02527; H01L 21/02529; H01L 21/02532; H01L 21/20; H01L 21/2033; H01L 21/2053; H01L 21/2251; H01L 21/2253; H01L 21/823807; H01L 21/0475; H01L 21/3065; H01L 21/3215; H01L 21/32155; H01L 21/47573; H01L 21/23857; H01L 21/82385; H01L 21/823814; H01L 21/67069; H01L 21/76837; H01L 21/76877; H01L 21/8232; H01L 21/823821; H01L 21/823842; H01L 29/66621; H01L 29/66628; H01L 29/66575; H01L 29/78687; H01L 29/4908; H01L 29/41733; H01L 29/6656; H01L 29/42392; H01L 29/66545; H01L 29/0673; H01L 29/401; H01L 29/1033; H01L 2029/42388; H01L 21/8221; H01L 21/0257; H01L 21/02603; H01L 21/823857; H01L 21/8238; H01L 27/0688; H01L 27/092; H01L 27/0922; H01L 29/42376; H01L 29/0847; H01L 29/78651; H01L 29/78696; H01L 29/66439; H01L 29/775; B82Y 10/00
USPC ... 257/351, 347, 24, 369, E27.112, E29.245, 257/E21.561; 438/479, 733
See application file for complete search history.

(56) References Cited

U.S. PATENT DOCUMENTS

| | | | |
|---|---|---|---|
| 9,287,357 | B2 | 3/2016 | Rodder et al. |
| 9,536,794 | B2 | 1/2017 | Chang et al. |
| 9,570,609 | B2 | 2/2017 | Obradovic et al. |
| 9,583,486 | B1 | 2/2017 | Ando et al. |
| 9,653,537 | B1 | 5/2017 | Jagannathan et al. |
| 9,660,028 | B1 | 5/2017 | Cheng et al. |
| 10,008,583 | B1 | 6/2018 | Rodder et al. |
| 10,014,390 | B1 | 7/2018 | Bouche et al. |
| 10,553,495 | B2 * | 2/2020 | Cheng ................ H01L 29/0847 |
| 2012/0193725 | A1 | 8/2012 | Li |
| 2014/0273377 | A1 | 9/2014 | Kim |
| 2014/0361378 | A1 | 12/2014 | Lee et al. |
| 2016/0071729 | A1 | 3/2016 | Hatcher et al. |
| 2017/0345915 | A1 | 11/2017 | Coquand et al. |
| 2017/0345945 | A1 * | 11/2017 | Lee ....................... H01L 29/775 |
| 2017/0365604 | A1 | 12/2017 | Suh et al. |

OTHER PUBLICATIONS

Zane H. Walker et al., Rate constants for the reaction of Cl atoms with intrinsic and n+-doped polycrystalline silicon, Department of Chemistry, University of British Columbia, Sep. 1990.
International Search Report for PCT/IB2018/058004 dated Jan. 9, 2019 (9 pages).
Office Action with cited art in corresponding U.S. Appl. No. 16/698,052 dated Oct. 15, 2020 (pp. 1-28).
U.S. Final Office Action issued in U.S. Appl. No. 16/698,052 dated Feb. 16, 2021, pp. 1-22.

* cited by examiner

NANOSHEET TRANSISTORS WITH DIFFERENT GATE DIELECTRICS AND WORKFUNCTION METALS

BACKGROUND

Technical Field

The present invention generally relates to semiconductor device fabrication and, more particularly, to field nanowire and nanosheet field effect transistors that have a spacing between channel layers that is greater than a critical thickness of a sacrificial material.

Description of the Related Art

Nanowire and nanosheet transistor devices may be created using silicon germanium as a sacrificial layer formed between layers of silicon. However, due to the lattice mismatch between silicon germanium crystals and silicon crystals, a strain is formed in the sacrificial silicon germanium layers. When the silicon germanium layers are formed to a thickness that is greater than a critical thickness, defects such as dislocations are formed in the stack.

For example, in silicon germanium having a germanium concentration of about 35%, the critical thickness is about 8 nm. Because the spacing between adjacent silicon channel layers is determined by the silicon germanium thickness, the small critical thickness limits the silicon channel spacing. This can make it difficult to pattern gate workfunction metals and form thick gate oxide transistors. The thick oxide gate dielectric pinches off the small gap between silicon channels, leaving no room for the gate workfunction metal. Even with thinner gate dielectrics, it is often advantageous to have different workfunction metals for different kinds of transistor. Removing the workfunction metal from the narrow gap between channels can necessitate an aggressive etch which can create an undesirable undercut between adjacent transistors.

SUMMARY

A method for forming a semiconductor device includes patterning a stack of layers that includes channel layers, n-type doped first sacrificial layers between the channel layers, and carbon-doped second sacrificial layers between the channel layers and the first sacrificial layers, to form one or more device regions. The first sacrificial layers and the second sacrificial layers are recessed relative to the channel layers with distinct respective etches to produce a flat, continuous, and vertical surface from sidewalls of the first sacrificial layers and respective second sacrificial layers. Inner spacers are formed in recesses formed by the recessing of the first sacrificial layers and the second sacrificial layers. The first sacrificial layers and the second sacrificial layers are etched away to leave the channel layers suspended.

A method for forming a semiconductor device includes patterning a stack of layers that includes silicon channel layers, sacrificial n-type doped silicon layers between the channel layers, and sacrificial carbon-doped silicon germanium diffusion barrier layers between the silicon channel layers and the sacrificial doped silicon layers, to form one or more device regions. The sacrificial n-type doped silicon layers and the sacrificial carbon-doped silicon germanium diffusion barrier layers are recessed relative to the channel layers with distinct respective etches to produce a flat, continuous, and vertical surface from sidewalls of the first sacrificial layers and respective second sacrificial layers. Inner spacers are formed, in recesses formed by the recessing of the sacrificial n-type doped silicon layers and the sacrificial carbon-doped silicon germanium layers, that have flat, vertical sidewalls facing the sacrificial n-type doped silicon layers and the sacrificial carbon-doped silicon germanium layers. The sacrificial n-type doped silicon layers and the sacrificial carbon-doped silicon germanium layers are etched away to leave the channel layers suspended.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention use multiple sacrificial layers, each having etch selectivity with the channel material, to form sacrificial layers at any appropriate thickness. This provides the present embodiments with the ability to form thick oxide gate dielectrics and to pattern workfunction metals as needed.

In one exemplary embodiment, a sacrificial layer is formed from a multilayer of, e.g., a first layer of silicon germanium, a middle layer of doped silicon, and a second layer of silicon germanium. The silicon germanium layers prevent dopants from the doped silicon layer from leeching out into the adjacent channel layers. Each constituent layer of the sacrificial multilayer can be selectively etched with respect to the channel material.

Figure 1:
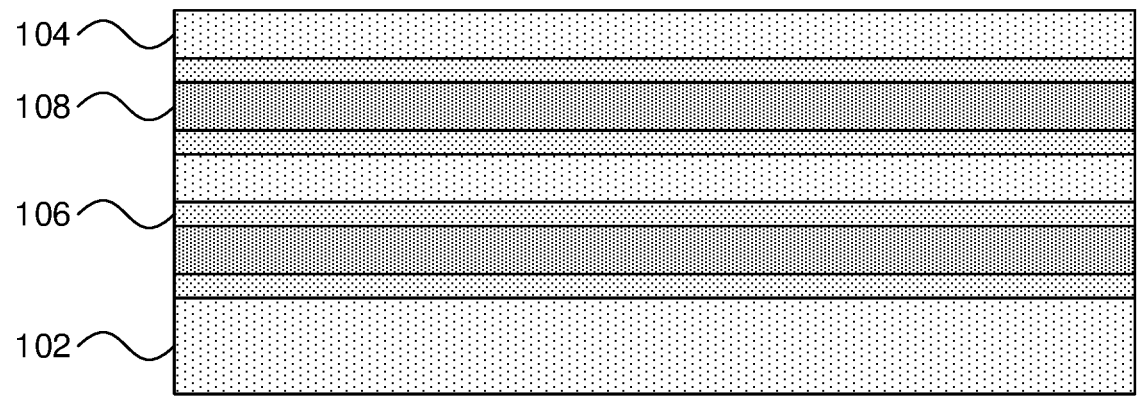
FIG. 1 is a cross-sectional diagram of a step in the formation of field effect transistors (FETs) having a large separation between vertically stacked channel layers in accordance with an embodiment of the present invention.

Referring now to FIG. 1, a cross-sectional diagram of a step in the formation of nanosheet field effect transistors (FETs) is shown. A stack of semiconductor layers is formed on a semiconductor substrate 102. The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, epitaxial silicon, and multi-layers thereof. Although silicon is the predominantly used semiconductor material in wafer fabrication, alternative semiconductor materials can be employed, such as, but not limited to, germanium, gallium arsenide, indium gallium arsenide, indium phosphide, gallium nitride, cadmium telluride, and zinc selenide. Although not depicted in the present figures, the semiconductor substrate 102 may also be a semiconductor on insulator (SOI) substrate.

The stack of layers is formed from three different compositions. It is specifically contemplated that a first set of layers 104 can be formed from a semiconductor channel material. It is specifically contemplated that the first set of layers 104 may be formed from silicon, but it should be understood that other appropriate semiconductor materials having appropriate etch selectivities may be used instead.

A second set of layers 106 can be formed from a first sacrificial material between the first set of layers 104. It is specifically contemplated that the second set of layers 106 may be formed from silicon germanium or carbon-doped silicon germanium, with a germanium concentration of about 35% and a carbon concentration of about 1%, but it should be understood that other concentrations and other appropriate sacrificial materials may be used instead. It should be noted that the lattice constant difference between silicon and silicon germanium with a 35% germanium concentration is greater than 1%.

A third set of layers 108 can be formed from a second sacrificial material between the second set of layers 106. It is specifically contemplated that the third set of layers 108 may be formed from an phosphorus-doped or arsenic-doped silicon, but it should be understood that other appropriate sacrificial materials may be used instead and, in particular, that n-type dopants may be used. The layers of the stack are deposited sequentially, from the bottom up, with a pattern ABACABAC . . . , where A represents the second set of layers 106, B represents the third set of layers 108, and C represents the first set of layers 104.

The compositions of the second set of layers 106 and the third set of layers 108 are selected to provide etch selectivity relative to the first set of layers 104. As used herein, the term "selective" in reference to a material removal process denotes that the rate of material removal for a first material is greater than the rate of removal for at least another material of the structure to which the material removal process is being applied. Thus the sacrificial materials of the second set of layers 106 and the third set of layers 108 can be removed from between the layers of channel material of the first set of layers 104 without substantially damaging the first set of layers 104. The composition of the second set of layers 106 is specifically selected to prevent diffusion of dopants in the third set of layers 108 into the first set of layers 104. While silicon germanium is often sufficient for this purpose, carbon-doped silicon germanium is superior in reducing dopant diffusion, preventing dopants from the sacrificial layer 108 from diffusing into the channel layers 104.

By using the third set of layers 108 to increase the thickness of sacrificial material between adjacent channel layers of the first set of layers 104, the separation between channel layers can be increased to any size without exceeding the critical thickness in the second set of layers 106. The thickness of the third set of layers 108 can be made any appropriate thickness without introducing substantial strain due to substantial matching of lattice constant between 108 and 104, while the thickness of the second set of layers 106 is kept below the critical thickness of the sacrificial material making up the second set of layers 106. In an embodiment where carbon-doped silicon germanium is used in the second set of layers 106, the thickness of the second set of layers 106 may be about three nanometers, while the thicknesses of the first set of layers 104 and the third set of layers 108 can be any appropriate thickness.

Each of the layers may be formed on top of the previous layer by epitaxial growth or any other appropriate deposition process. Epitaxial growth at this stage can be performed with relatively high quality, as each previous layer provides a good seed layer for the growth of the next layer. The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The third set of layers 108 may be formed by such an epitaxial process with in situ doping using an n-type dopant. It is specifically contemplated that n-type dopant atoms cause little change to the lattice constant of silicon, but any appropriate dopant may be used to achieve the effect of maintaining the lattice constant of the semiconductor material in the third set of layers 108. In some embodiments, the lattice constant difference between the third set of layers 108 and the channel layers 104 is less than about 0.3%. As used herein, "n-type" refers to the addition of impurities that contributes free electrons to an intrinsic semiconductor. In a silicon containing layer, examples of n-type dopants include but are not limited to antimony, arsenic, and phosphorous.

Figure 2:
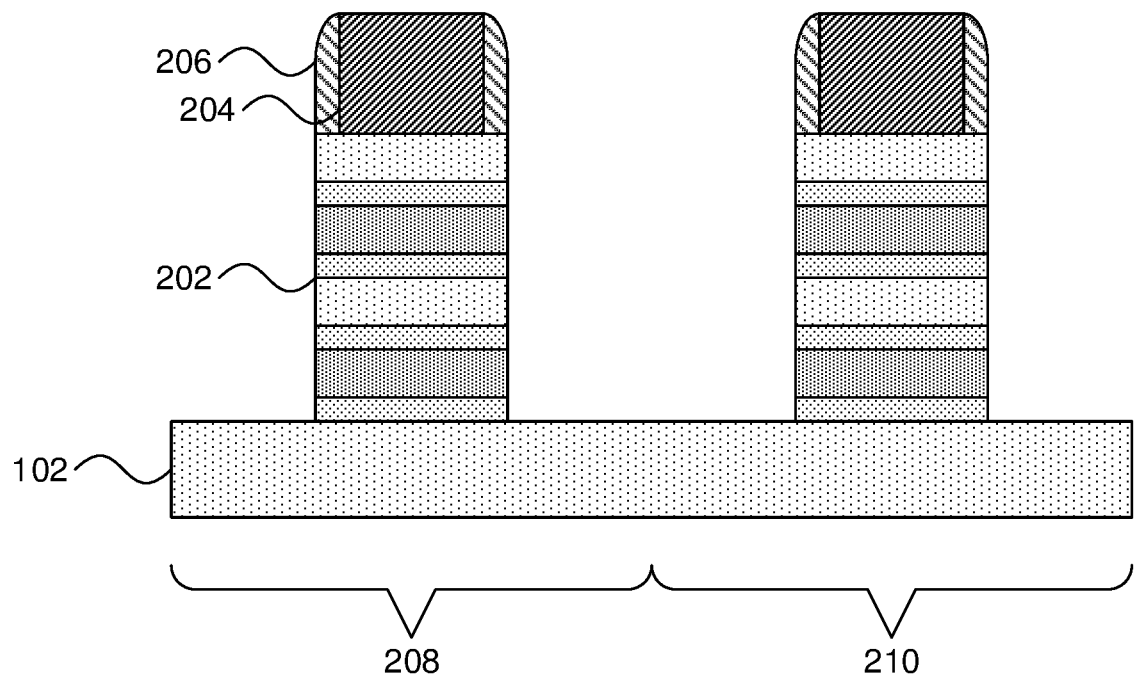
FIG. 2 is a cross-sectional diagram of a step in the formation of FETs having a large separation between vertically stacked channel layers showing the patterning of device regions in accordance with an embodiment of the present invention.

Referring now to FIG. 2, a cross-sectional diagram of a step in the formation of nanosheet FETs is shown. A dummy gate stack is formed on the stack of layers. The dummy gate stack includes a dummy gate 204 and a spacer 206 on dummy gate sidewalls. The dummy gate 204 may include a dummy gate dielectric (e.g., silicon oxide) around the nanosheet stack, a dummy gate placeholder (e.g., amorphous silicon) around the dummy gate dielectric, and dummy gate hardmask (e.g., silicon nitride) on top of the dummy gate placeholder. The spacers 206 may comprises any suitable dielectric material, including but not limited to silicon nitride, silicon oxynitride, silicon oxide, silicoboron carbonitride, silicon oxycarbonitride, silicon oxycarbide, silicon carbonitride, or any suitable combination of those materials. The dummy gate 204 can be patterned by any suitable patterning techniques, including but not limited to lithography followed by directional etch (e.g., reactive ion etch (RIE)), sidewall imaging transfer, self-aligned double or quadruple patterning. The spacers 206 can be formed by deposition followed by RIE processing.

The dummy gate stack is used as a mask to anisotropically etch the stack of layers, forming sheet stacks 202. The sheet stacks 202 are formed in at least two regions, including a first region 208 and a second region 210. In some embodiments, the first region 208 is used to form a first FET (e.g., an n-type FET) with one type of workfunction metal while the second region 210 is used to form a second FET (e.g., p-type FET) with a second type of workfunction metal. In some embodiments, the first region 208 and the second region 210 may have the same type of FETs (e.g., both are n-type FETs or p-type FETs) with different workfunction metals. In other embodiments, the first region 208 and the second region 210 may have different types of gate dielectric, and in still other embodiments the first region 208 and the second region 210 may differ in both work function metal and in gate dielectric. The sheet stacks 202 may have any appropriate geometry, with the width of the sheet stacks 202 determining the eventual width of the FET channel regions.

In one embodiment, the sheet stacks 202 may be formed by a selective RIE using the dummy gate stack as a mask. RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

It should be noted that, although the present embodiments are specifically described with respect to nanosheets, the same principles apply to the fabrication of nanowire devices. As used herein, the term "nanosheet" refers to a structure that has a ratio of its cross-sectional width to its cross-sectional height greater than about 2:1, whereas the term "nanowire" refers to a structure that has a ratio of its cross-sectional width to its cross-sectional height less than about 2:1. The shape of the sheet stacks 202 determines whether a "nanosheet" structure or a "nanowire" structure is formed.

Figure 3:
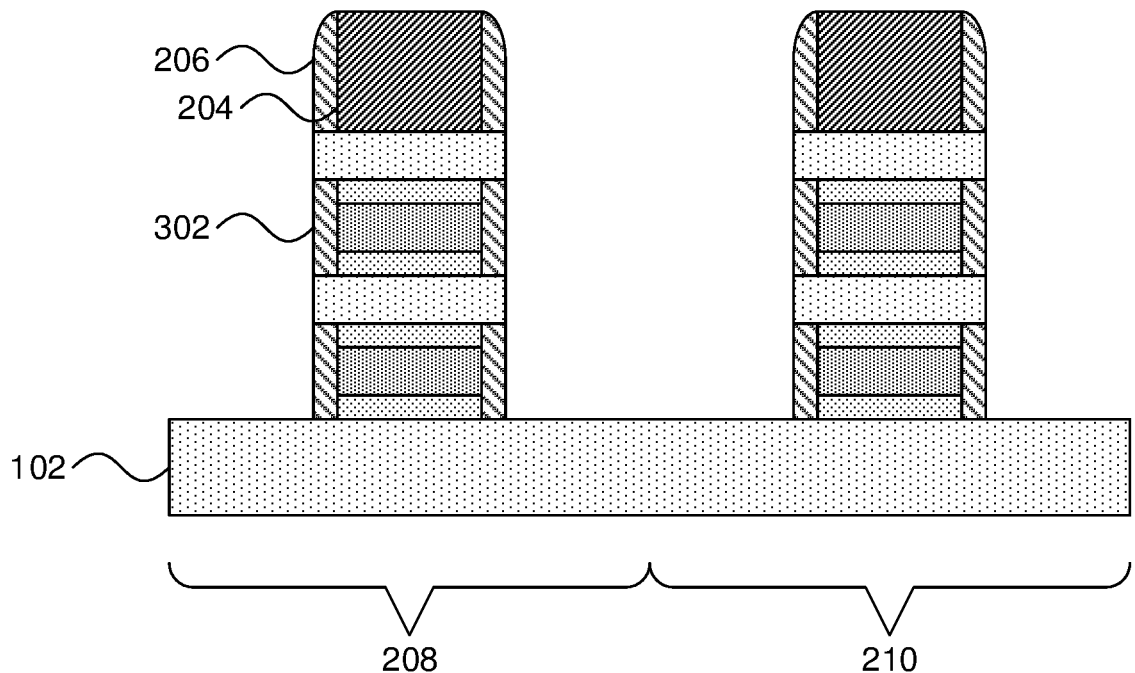
FIG. 3 is a cross-sectional diagram of a step in the formation of FETs having a large separation between vertically stacked channel layers showing the formation of inner spacers in accordance with an embodiment of the present invention.

Referring now to FIG. 3, a cross-sectional view of a step in the fabrication of a nanosheet FET is shown. The second and third sets of layers 106 and 108 are recessed relative to the first layers 104 using one or more selective, isotropic etches. In a specific embodiment, the selective, isotropic etches preferentially removes silicon germanium material and doped silicon material, leaving layers of undoped silicon relatively untouched.

It is specifically contemplated that the etches of the second and third sets of layers 106 and 108 may be wet or dry chemical etches. The etch of the third set of layers 108 may include, e.g., an etch in a chlorine gas at a partial pressure of about 0.17 Torr in a temperature range between about 25° C. and about 90° C. If an n-type doped silicon material is used in the third set of layers 108 and intrinsic silicon is used in the first set of layers 104 under these conditions, the third set of layers 108 will be etched at a rate about 90 times greater than an etching rate of the first set of layers 104. The etch of the second set of layers 106 may be performed using an appropriate wet etch such as, e.g., hydrogen peroxide with hydrofluoric acid, nitric acid with hydrofluoric acid, or ammonium hydroxide with hydrogen peroxide. It should be understood that other etch chemistries may be needed for the selective removal of the sacrificial material if the sacrificial materials are selected to be other than those described above.

Additional spacer material 302 is then formed at the recessed ends of the set and third sets of layers 106 and 108 in the sheet stacks 202. This additional spacer material 302 may be deposited using, e.g., a conformal deposition process and subsequently isotopically or anisotropically etched back to remove excess spacer material on the vertical sidewalls of the nanosheet stack structure and on the surface of the semiconductor substrate 102, with the additional spacer material 302 being protected by the dummy gate stack above it.

The additional spacer material 302 may be formed from the same or different material as the spacer layer 206 of the dummy gate stack (e.g., silicon nitride). For example, the embedded spacer material 302 can be formed of silicon nitride, silicoboron carbonitride, silicon carbonitride, silicon carbon oxynitride, or any other type of dielectric material (e.g., a dielectric material having a dielectric constant k of less than 5) appropriate to the role of forming an insulating gate sidewall spacers of FET devices.

In one embodiment, the dielectric material is conformally deposited using a highly conformal deposition process, such as atomic layer deposition (ALD), to ensure that the recesses area are sufficiently filled with dielectric material. Other deposition methods such as chemical vapor deposition (CVD) can be used to deposit a highly conformal layer of dielectric material to fill the recesses area. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use ALD, chemical precursors react with the surface of a material one at a time to deposit a thin film on the surface.

Figure 4:
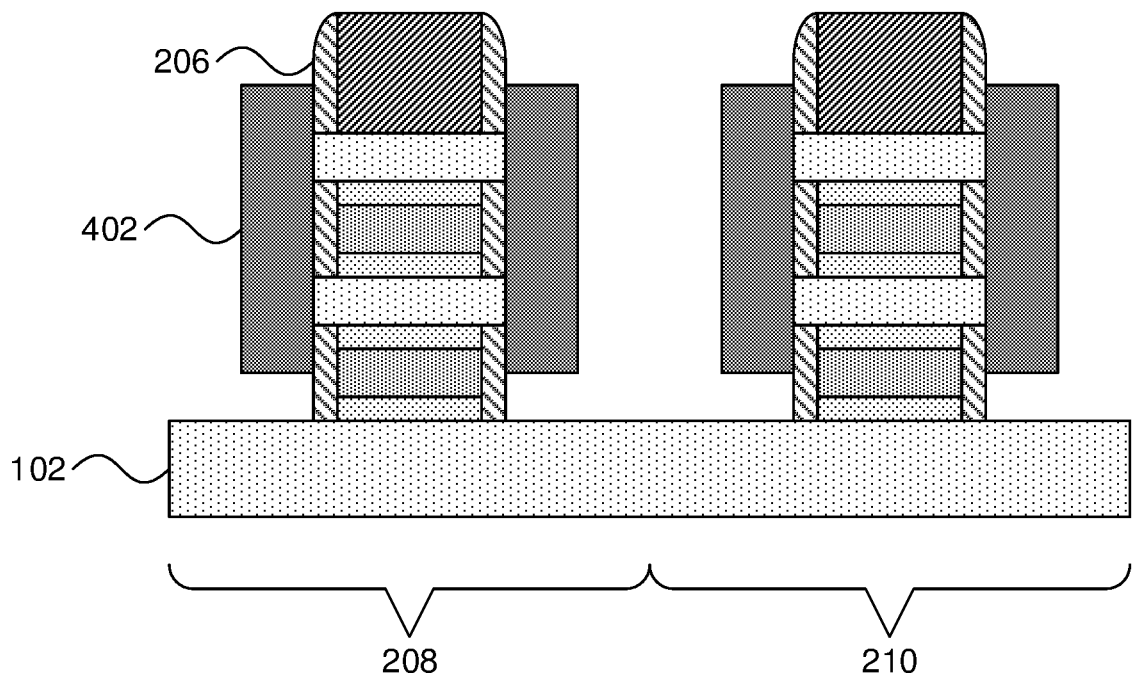
FIG. 4 is a cross-sectional diagram of a step in the formation of FETs having a large separation between vertically stacked channel layers showing the formation of source and drain regions in accordance with an embodiment of the present invention.

Referring now to FIG. 4, a cross-sectional view of a step in the fabrication of a nanosheet FET is shown. Source and drain regions 402 are formed in contact with the ends of the layers of the first material 104. In one embodiment, the source and drain regions 402 may be epitaxially grown from these surfaces and in situ doped with a conductivity type appropriate to the type of device being fabricated.

As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous.

Figure 5:
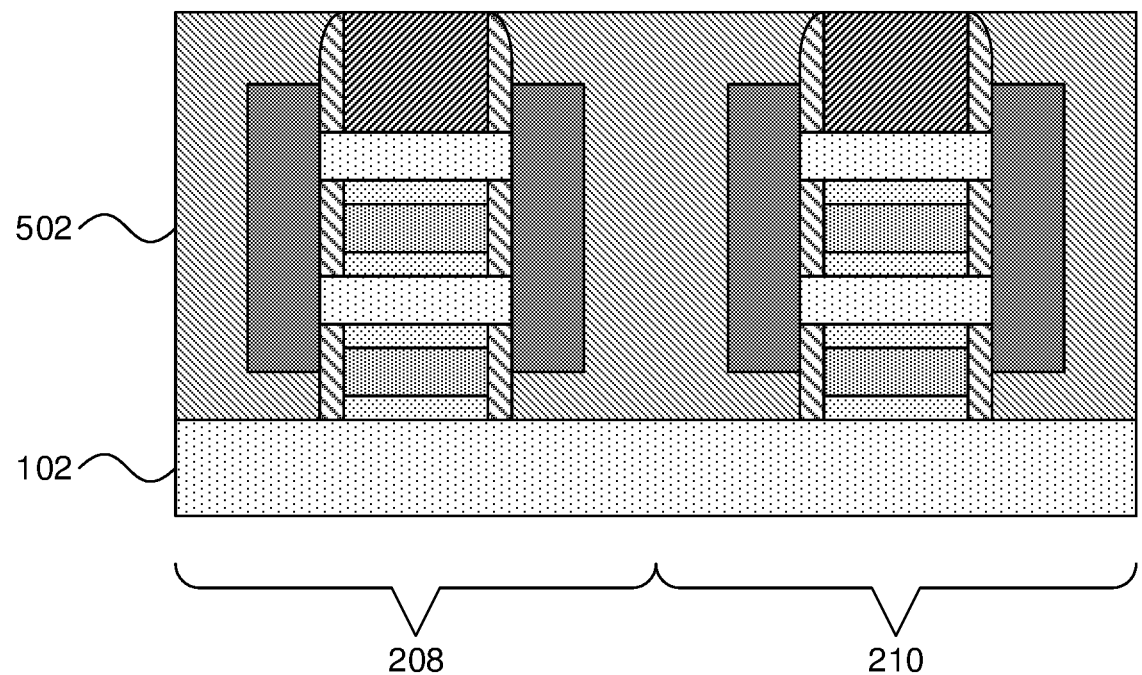
FIG. 5 is a cross-sectional diagram of a step in the formation of FETs having a large separation between vertically stacked channel layers showing the formation of an inter-layer dielectric in accordance with an embodiment of the present invention.

Referring now to FIG. 5, a cross-sectional view of a step in the fabrication of a nanosheet FET is shown. A dielectric material or a combination of dielectric materials is formed over and around the regions 208 and 210 and is then planarized down to the level of dummy gate 204 using, e.g., a chemical mechanical planarization (CMP) process to form inter-layer dielectric 502. In some embodiments, the inter-layer dielectric 502 includes silicon nitride and silicon oxide.

Figure 6:
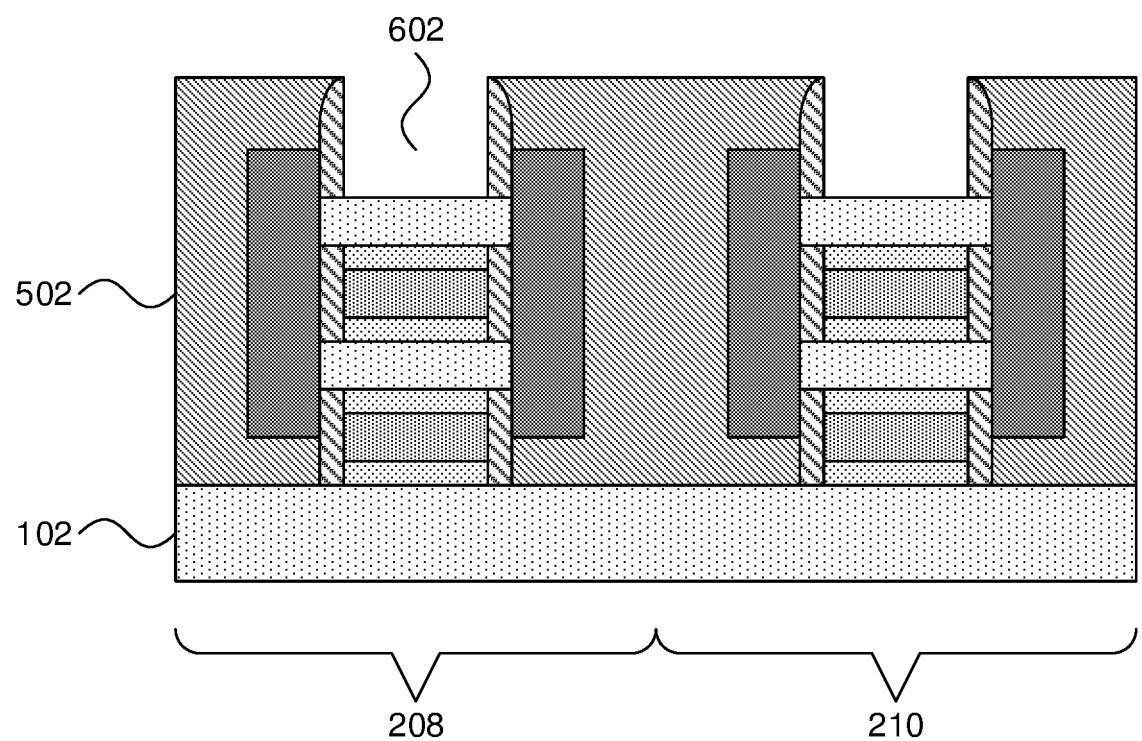
FIG. 6 is a cross-sectional diagram of a step in the formation of FETs having a large separation between vertically stacked channel layers showing the removal of a dummy gate structure in accordance with an embodiment of the present invention.

Referring now to FIG. 6, a cross-sectional view of a step in the fabrication of a nanosheet FET is shown. The dummy gate 210 and the dummy gate hardmask 212 are removed by any appropriate etching process, exposing the underlying sheet stacks 202 and forming an opening 602.

Figure 7:
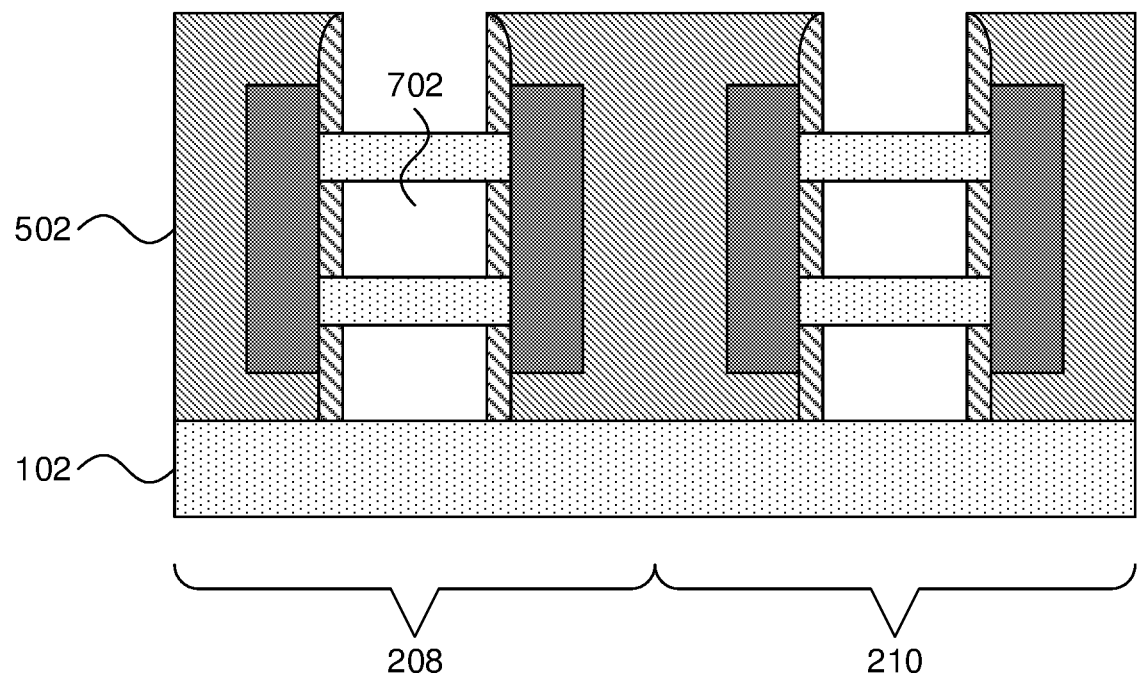
FIG. 7 is a cross-sectional diagram of a step in the formation of FETs having a large separation between vertically stacked channel layers showing the removal of sacrificial layers in accordance with an embodiment of the present invention.

Referring now to FIG. 7, a cross-sectional view of a step in the fabrication of a nanosheet FET is shown. The material of the third set of layers 108 and the second set of layers 106 selectively etched away in both the first and second region 208 and 210. This leaves openings 702 between the first set of layers 104. The same etches that were used to selectively recess the second and third sets of layers 106 and 108 may be used to remove the sacrificial material entirely.

From this point, several different kinds of devices can be formed. In particular, devices having different gate dielectrics, different work function metals, or both can be formed in the first region 208 and the second region 210. Some examples of these embodiments are described below.

Figure 8:
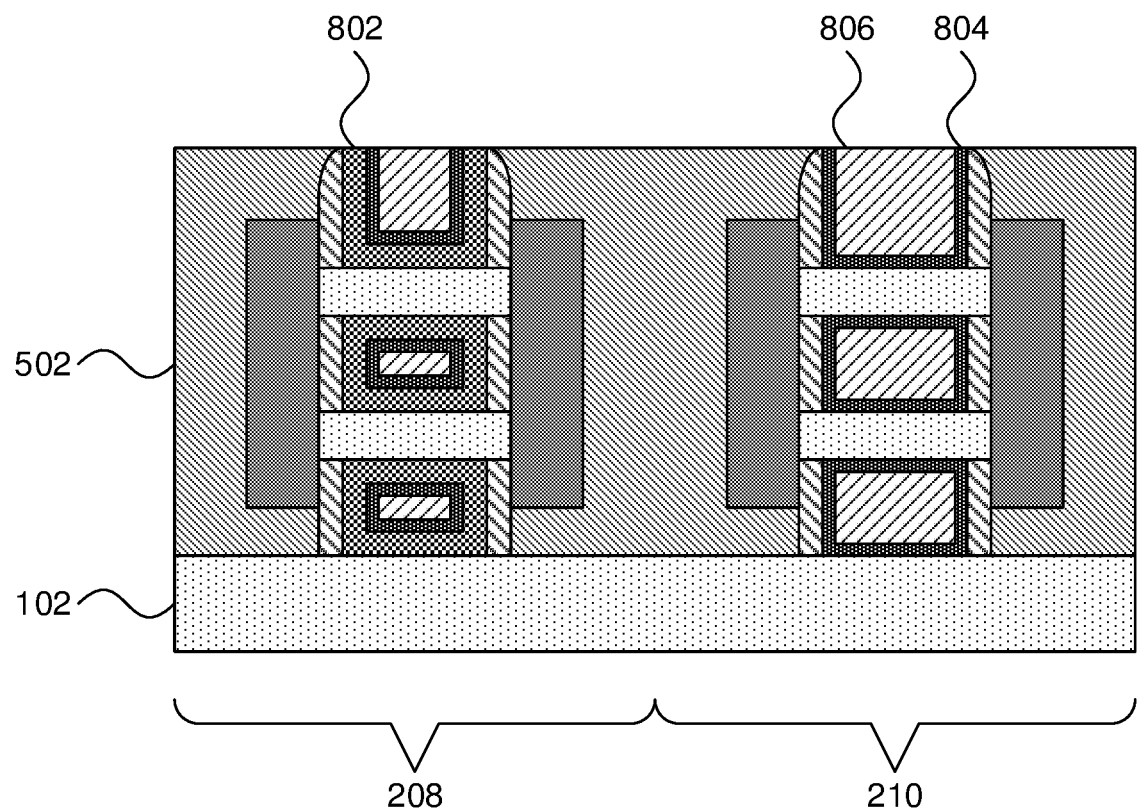
FIG. 8 is a cross-sectional diagram of a step in the formation of FETs having a large separation between vertically stacked channel layers showing the formation of a gate stack in accordance with an embodiment of the present invention.

Referring now to FIG. 8, a cross-sectional view of a step in the fabrication of FETs having different gate dielectrics is shown. By masking one region and then the other, a layer of thick oxide dielectric material 802 (having a thickness between about 2 nm and about 5 nm) is conformally deposited in the first region 208 and a thinner region of high-k dielectric material 804 is conformally deposited in the second region 210, over and around the channel layers. Because the channel layers 104 have a wide separation, it is possible to have significantly thicker dielectric layers, like the thick oxide dielectric layer 802, than would otherwise be possible.

The thick oxide dielectric material is patterned after deposition to remove it from the second region 210. It should be noted that the high-k dielectric material 804, which may be deposited much more thinly than the thick oxide dielectric layer 802, may be patterned to limit it to only the second region 210, but can in some embodiments be deposited over both regions 208 and 210 without removal of the high-k dielectric material from the region having the thick oxide material 802. A metal gate 806 is deposited in both regions. In some embodiments, the metal gate includes a workfunction metal. In some embodiments, the metal gate includes a workfunction metal overlying the high-k gate dielectric and a gate conductor filling the rest of the gate opening.

It is specifically contemplated that the layer of thick oxide dielectric material 802 may be formed from, e.g., silicon dioxide, while the layer of high-k dielectric material 804 may be formed from any appropriate dielectric material having a dielectric constant higher than that of silicon dioxide including, e.g., hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum and aluminum. As an alternative to filling the remaining gap 702 entirely with workfunction metal 806, some embodiments may deposit only a layer of workfunction metal and fill the rest of gap 702 with tungsten or some other appropriate gate conductor.

It is specifically contemplated that an appropriate workfunction material will be selected in accordance with the type of device being fabricated. For example, a p-type work function metal may be used to create a p-type threshold voltage shift in a p-type FET, while an n-type work function metal may be used to create an n-type threshold voltage shift in an n-type device. Examples of p-type work function metals include titanium nitride, titanium aluminum nitride, ruthenium, platinum, molybdenum, cobalt, and combinations thereof. Examples of n-type work function metals include titanium aluminum alloys, tantalum nitride, titanium nitride (depending on deposition parameters), hafnium nitride, and hafnium silicon.

Figure 9:
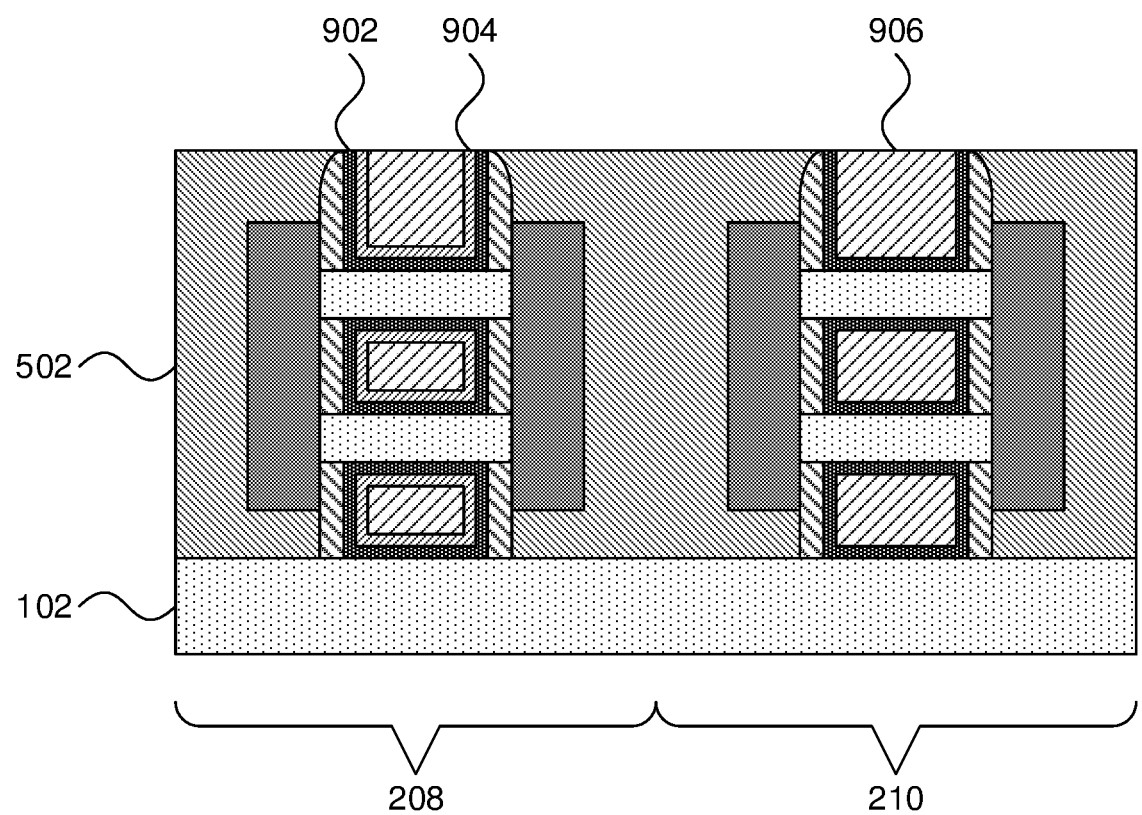
FIG. 9 is a cross-sectional diagram of a step in the formation of FETs having a large separation between vertically stacked channel layers showing the formation of a gate stack in accordance with an embodiment of the present invention.

Referring now to FIG. 9, a cross-sectional view of a step in the fabrication of FETs having different workfunction metals is shown. In this embodiment, the first region 208 is used to create an n-type FET, while the second region 210 is used to create a p-type FET, each with different workfunction metals. A gate dielectric 902 is conformally deposited in both regions.

A first workfunction metal 904 (e.g., an n-type workfunction metal in this example, although a p-type workfunction metal could be deposited first in other embodiments) is deposited in the first region 208, with the second region 210 being masked. A second workfunction metal 906 (in this example a p-type workfunction metal) is then deposited across both the first region 208 and the second region 210. A p-type workfunction metal that is deposited on top of an n-type workfunction metal in this manner will not affect the threshold voltage of the finished transistor. As above, the second workfunction metal 906 may pinch off the gap 702, or a fill of an appropriate gate conductor may be used as shown. The relatively large spacing between adjacent channel layers 104 makes patterning the first workfunction material easier, allowing for the removal of that material from, e.g., the second region 210.

As noted above, these two embodiments can be combined, with differing workfunction metals on thick oxide gate dielectrics. The larger space between vertically adjacent channels leaves significantly more freedom for device design variations as compared to conventional devices.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 10:
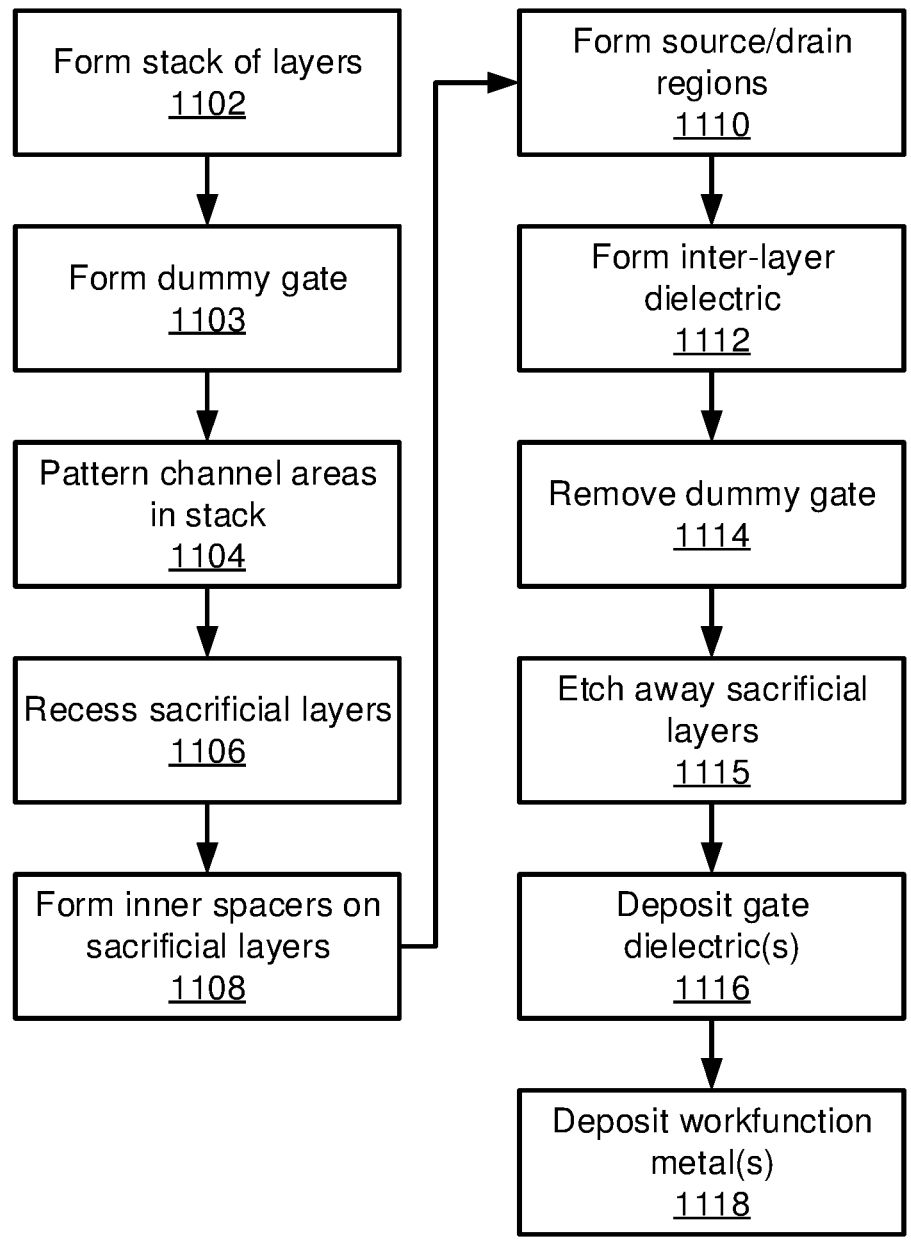
FIG. 10 is a block/flow diagram of a method of forming FETs having a large separation between vertically stacked channel layers in accordance with an embodiment of the present invention.

Referring now to FIG. 10, a method of forming a FET is shown. Block 1102 forms the stack of layers, including first set of layers 104, second set of layers 106, and third set of layers 108, with the first set of layers 104 being formed from a channel material such as crystalline silicon and with the second and third sets of layers 106 and 108 being formed from sacrificial materials such as carbon-doped silicon germanium and n-type doped silicon, respectively. It is specifically contemplated that block 1102 may deposit these layers by epitaxial growth, but it should be understood that any appropriate deposition process may be used instead.

Block 1103 forms dummy gates 202 on the stack of layers. The dummy gates 204 are formed from a material such as, e.g., polysilicon, with spacers 206 being formed on the sidewalls of the dummy gates 202. Block 1104 then patterns the stack of layers using the dummy gates 204 and spacers 206 as a mask, creating columns 202. It should be understood that the dimensions of the dummy gate 204 and the spacers 206 will thereby determine the dimensions of the channels that are produced, with different dimensions producing nanowires or nanosheets.

Block 1106 recesses the sacrificial layers using appropriate wet or dry chemical etches. It is specifically contemplated that these etches should be selective to the channel material of the first set of layers 104, such that the channel structures are not damaged by recessing the sacrificial layers. This may be performed in one etch or in two separate etches. Block 1108 then forms inner spacers 302 on the sidewalls of the sacrificial layers, for example by conformally depositing a layer of spacer material (e.g., silicon nitride) and then using an anisotropic etch to remove the deposited spacer material from horizontal surfaces.

Block 1110 forms source and drain regions 402 on the sidewalls of the channel structures by, e.g., an epitaxial growth process with in situ doping. The dopant used in the source and drain regions 402 will help determine whether the device is an n-type device or a p-type device. As noted above, different types of devices may be formed in different regions, for example with a first type of device being formed in a first region 208 and with a second type of device being formed in a second region 210. To accomplish this, block 1110 may mask certain regions while the source and drains of devices in other regions are being formed.

Block 1112 forms an inter-layer dielectric around the structures. This may be accomplished by depositing, for example, a flowable oxide to a height above the dummy gates 204 and then polishing the oxide material down to expose the dummy gates 204 using a CMP process that stops on the material of the dummy gates 204. The dummy gates 204 may then be removed by any appropriate etch in block 1114, leaving the stack of layers in columns 202 exposed.

Block 1115 etches away the sacrificial layers in columns 202 in one or more wet or dry chemical etch steps, removing the sacrificial layers from between the channel layers. Block 1116 deposits a gate dielectric using a conformal deposition process that deposits layer of gate dielectric material with roughly equal thickness on all exposed surfaces. It should be understood that block 1116 may include multiple such depositions to deposit different gate dielectric materials in different regions by, e.g., masking regions before depositing a gate dielectric in other regions. The first region 208 and the second region 210 may therefore have different gate dielectric materials. It is specifically contemplated that at least one region may have a thick oxide dielectric material as its gate dielectric, which is made possible by a large spacing between vertically adjacent channel structures.

Block 1118 then deposits workfunction metal on the gate dielectric layer(s). As with the gate dielectrics, the workfunction metal may differ between regions, particularly with respect to whether the device in that region is to be an n-type or a p-type FET. To form different types of devices in different regions then, masks may be used to cover regions while the workfunction metal is being deposited elsewhere. Alternatively, block 1118 may deposit workfunction metal over all surfaces and subsequently etch it away in regions where a different workfunction metal is needed. In such embodiments the second workfunction metal may be deposited over the first workfunction metal in regions where the first workfunction metal remains.

Block 1120 then finishes the device. If the workfunction metal does not pinch off the gap above the channels, then a gate contact metal such as, e.g., tungsten may be used to reduce contact resistance. Additional contacts are formed to the source and drain regions by anisotropically etching a contact hole through the inter-layer dielectric 502 and depositing a contact conductor to provide electrical connectivity between the source/drain regions 402 and the surface of the inter-layer dielectric.

While it is specifically contemplated that tungsten may be used for the gate contact metal and the source/drain contact metals, it should be understood that any appropriate conductor may be used instead. Other examples include, e.g., nickel, titanium, molybdenum, tantalum, copper, platinum, silver, gold, ruthenium, iridium, rhenium, rhodium, and alloys thereof. The gate conductor may alternatively include a doped semiconductor material such as, e.g., doped polysilicon.

Having described preferred embodiments of nanosheet transistors with different gate dielectrics and workfunction metals (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
   patterning a stack of layers that includes channel layers, n-type doped first sacrificial layers having a first thickness between the channel layers, and carbon-doped second sacrificial layers having a second thickness between the channel layers and the first sacrificial layers, to form one or more device regions, wherein the second thickness is less than a dislocation thickness to cause dislocations between the second sacrificial layers and the channel layers, and wherein a combination of the first thickness and the second thickness is greater than the dislocation thickness;
   recessing the first sacrificial layers and the second sacrificial layers relative to the channel layers with distinct respective etches to produce a flat, continuous, and vertical surface from sidewalls of the first sacrificial layers and respective second sacrificial layers;
   forming inner spacers in recesses formed by the recessing of the first sacrificial layers and the second sacrificial layers; and
   etching away the first sacrificial layers and the second sacrificial layers to leave the channel layers suspended.

2. The method of claim 1, wherein the channel layers are formed from crystalline silicon, the first sacrificial layers are formed from doped silicon, and the second sacrificial layers comprise silicon germanium.

3. The method of claim 2, wherein recessing the first sacrificial layers comprises a chlorine gas etch at a partial pressure of about 0.17 Torr in a temperature range between 25° C. and 90° C. and wherein recessing the second sacrificial layers comprises a wet etch selected from the group consisting of a hydrogen peroxide and hydrofluoric acid etch, a nitric acid and hydrofluoric acid etch, and an ammonium hydroxide and hydrogen peroxide etch.

4. The method of claim 1, wherein the first sacrificial layers and the second sacrificial layers are each etched away in a respective etch, wherein each respective etch selectively removes a respective sacrificial material without damaging the channel layers.

5. The method of claim 1, further comprising forming the stack of layers by epitaxially growing the channel layers, the first sacrificial layers, and the second sacrificial layers in a repeating ABAC pattern.

6. The method of claim 5, wherein A layers represent the second sacrificial layers, B layers represent the first sacrificial layers, and C layers represent the channel layers.

7. The method of claim 1, wherein the second sacrificial layers comprise silicon germanium and wherein a thickness of the second sacrificial layers is less than about 8 nm.

8. The method of claim 1, wherein the one or more device regions comprise an n-type device region and a p-type device region.

9. The method of claim 8, further comprising forming a gate stack in at least one of the n-type region and the p-type region, including forming a dual layer of workfunction metals.

10. The method of claim 1, further comprising depositing a gate stack, including forming an oxide dielectric layer on the suspended channel layers of at least one device region.

11. The method of claim 10, wherein the oxide dielectric layer has a thickness between about 2 nm and about 5 nm.

12. A method for forming a semiconductor device, comprising:
   patterning a stack of layers that includes silicon channel layers, sacrificial n-type doped silicon layers having a first thickness between the channel layers, and sacrificial carbon-doped silicon germanium diffusion barrier layers having a second thickness between the silicon channel layers and the sacrificial doped silicon layers, to form one or more device regions, wherein the second thickness is less than a dislocation thickness to cause dislocations between the sacrificial carbon-doped silicon germanium diffusion barrier layers and the channel layers, and wherein a combination of the first thickness and the second thickness is greater than the dislocation thickness;
   recessing the sacrificial n-type doped silicon layers and the sacrificial carbon-doped silicon germanium diffusion barrier layers relative to the channel layers with distinct respective etches to produce a flat, continuous, and vertical surface from sidewalls of the sacrificial n-type doped silicon layers and respective sacrificial carbon-doped silicon germanium diffusion barrier layers;
   forming inner spacers, in recesses formed by the recessing of the sacrificial n-type doped silicon layers and the sacrificial carbon-doped silicon germanium layers, that have flat, vertical sidewalls facing the sacrificial n-type doped silicon layers and the sacrificial carbon-doped silicon germanium layers;
   etching away the sacrificial n-type doped silicon layers and the sacrificial carbon-doped silicon germanium layers to leave the channel layers suspended.

13. The method of claim 12, wherein the sacrificial doped silicon layers and the sacrificial silicon germanium layers are each etched away in a respective etch, wherein each respective etch selectively removes a respective sacrificial material without damaging the channel layers.

14. The method of claim 12, further comprising forming the stack of layers by epitaxially growing the silicon channel layers, the sacrificial doped silicon layers, and the sacrificial silicon germanium layers in a repeating ABAC pattern.

15. The method of claim 14, wherein A layers represent the sacrificial silicon germanium layers, B layers represent the sacrificial doped silicon layers, and C layers represent the silicon channel layers.

16. The method of claim 12, wherein a thickness of the sacrificial silicon germanium layers is less than about 8 nm.

17. The method of claim 12, wherein the one or more device regions comprise an n-type device region and a p-type device region.

18. The method of claim 17, further comprising forming a gate stack in at least one of the n-type region and the p-type region, including forming a dual layer of workfunction metals.

19. The method of claim 12, wherein recessing the sacrificial n-type doped silicon layers comprises a chlorine gas etch at a partial pressure of about 0.17 Torr in a temperature range between 25° C. and 90° C. and wherein recessing the sacrificial carbon-doped silicon germanium diffusion barrier layers comprises a wet etch selected from the group consisting of a hydrogen peroxide and hydrofluoric acid etch, a nitric acid and hydrofluoric acid etch, and an ammonium hydroxide and hydrogen peroxide etch.

20. The method of claim 1, further comprising forming the stack of layers by epitaxial growth of the channel layers, the first sacrificial layers, and the second sacrificial layers.

* * * * *